(12) United States Patent
Whikehart

(10) Patent No.: US 6,393,450 B1
(45) Date of Patent: May 21, 2002

(54) SWITCHED BANDWIDTH DIGITAL FILTERS WITH SLEWING

(75) Inventor: J. William Whikehart, Novi, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/382,727

(22) Filed: Aug. 25, 1999

(51) Int. Cl.⁷ .............................................. G06F 17/10
(52) U.S. Cl. ...................................................... 708/316
(58) Field of Search .......................... 708/316; 455/266

(56) References Cited

U.S. PATENT DOCUMENTS

| | | | |
|---|---|---|---|
| 4,352,208 A | 9/1982 | Schroeder | |
| 4,356,567 A | 10/1982 | Eguchi et al. | |
| 4,691,292 A | * 9/1987 | Rothweiler | ................. 708/316 |
| 5,155,862 A | 10/1992 | Hansen | |
| 5,287,556 A | 2/1994 | Cahill | |
| 5,303,413 A | 4/1994 | Braegas | |
| 5,307,515 A | 4/1994 | Kuo et al. | |
| 5,777,911 A | * 7/1998 | Sherry et al. | ................. 708/316 |

* cited by examiner

Primary Examiner—Tan V. Mai
(74) Attorney, Agent, or Firm—Larry I. Shelton

(57) ABSTRACT

A switched bandwidth filter in a digital signal processor selectively provides a first bandwidth characteristic or a second bandwidth characteristic by loading separate first and second sets of filter coefficients into the digital filter. When switching between bandwidth characteristics, the coefficients of a selected filter section are slewed and the coefficients of all other sections are swapped at a time separate from the slewing. Thus, the benefits of slewing are obtained with minimal computation or storage requirements.

10 Claims, 3 Drawing Sheets

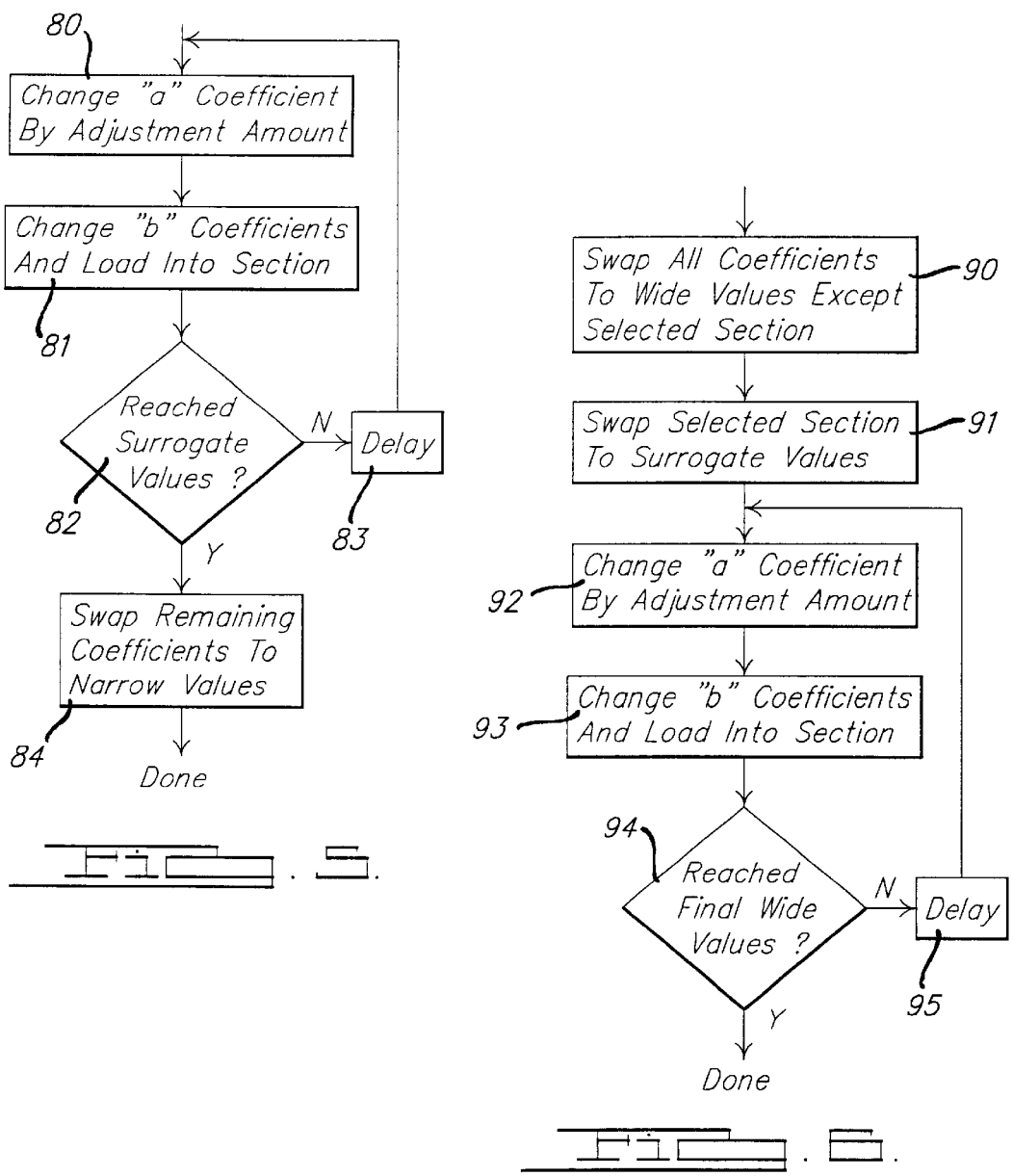
FIG. 5.
FIG. 6.
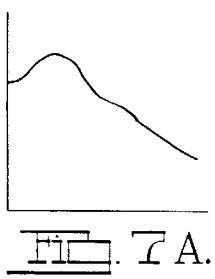
FIG. 7A.
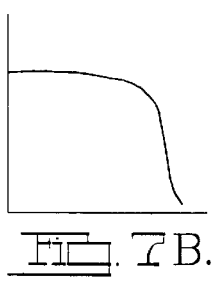
FIG. 7B.
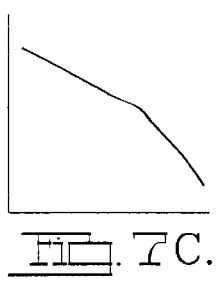
FIG. 7C.
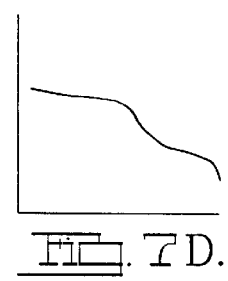
FIG. 7D.

SWITCHED BANDWIDTH DIGITAL FILTERS WITH SLEWING

BACKGROUND OF THE INVENTION

The present invention relates in general to switched bandwidth digital filters using swapped coefficient sets, and more specifically, to slewing a subset of the coefficients to reduce audible effects during switching.

Digital filters manipulate discrete samples of an input signal to produce a filtered output signal. Various filter structures are known in the art, such as those for finite impulse-response (FIR) filters and infinite impulse-response (IIR) filters. Higher order IIR filters (providing more selectivity) are typically implemented using a plurality of lower order filters connected in cascade.

During processing of a signal, it may become necessary to change the filtering of the signal (e.g., a change in bandwidth, passband characteristic, group delay, or other filter parameters). To minimize hardware and/or software requirements, it is desirable to use the same filter structure before and after the change by merely changing the digital filter coefficients.

In a digital signal processing (DSP) radio receiver, for example, a digital channel filter is applied to an intermediate frequency (IF) signal to select the desired signal and reject other broadcast signals. A wide or a narrow passband may be used for the channel filter depending upon the presence of interfering adjacent or alternate channel broadcast signals. When switching between the two bandwidths by switching between two coefficient sets in a DSP filter, the sudden change in bandwidth may be noticeable to the listener and may lead to a perception of poor quality.

It would be possible to gradually slew the bandwidth between wide and narrow, but the computation and/or storage requirements for updating all the coefficients of the filter during slewing would be too great and would be expensive.

SUMMARY OF THE INVENTION

The present invention has the advantage of eliminating a sudden bandwidth change without slewing a large number of coefficients within the filter.

In one aspect of the invention, a method is provided for slewing between a first bandwidth characteristic and a second bandwidth characteristic in a switched bandwidth digital filter including a plurality of second-order filter sections. Each of the sections comprises respective coefficients having a first set of values in providing the first bandwidth characteristic and having a second set of values in providing the second bandwidth characteristic. The coefficients of a selected filter section are slewed between the first set of values and a surrogate set of values while coefficients in the filter sections other than the selected filter section are held constant. The coefficients of the filter sections other than the selected filter section are swapped from their respective first set of values to their respective second set of values. When going from wideband to narrowband, the slewing step may preferably be performed before the swapping step. For going from narrowband to wideband, the swapping step may preferably be performed before the slewing step. In each case, the slewing/swapping order might sometimes be reversed, depending on analysis and/or subjective listening, and depending on how easy it is to find a good surrogate set of values.

The selected filter section is preferably the one section which has the most critically damped characteristic (i.e., most flat within the passband). The surrogate coefficients of the selected section are designed, in combination with the remaining unchanged sections, to provide a passband characteristic which approximates an overall passband of said digital filter when it is providing its narrower bandwidth characteristic.

BRIEF DESCRIPTION OF THE DRAWINGS

FIG. 5 is a flowchart showing the switching of the filter bandwidth from wide to narrow.

FIG. 6 is a flowchart showing the switching of the filter bandwidth from narrow to wide.

FIGS. 7A–7D show sequential filter section spectra according to a coefficient set for providing a wide passband, which forms a basis for selecting a filter section for slewing.

DETAILED DESCRIPTION OF PREFERRED EMBODIMENTS

Figure 1:
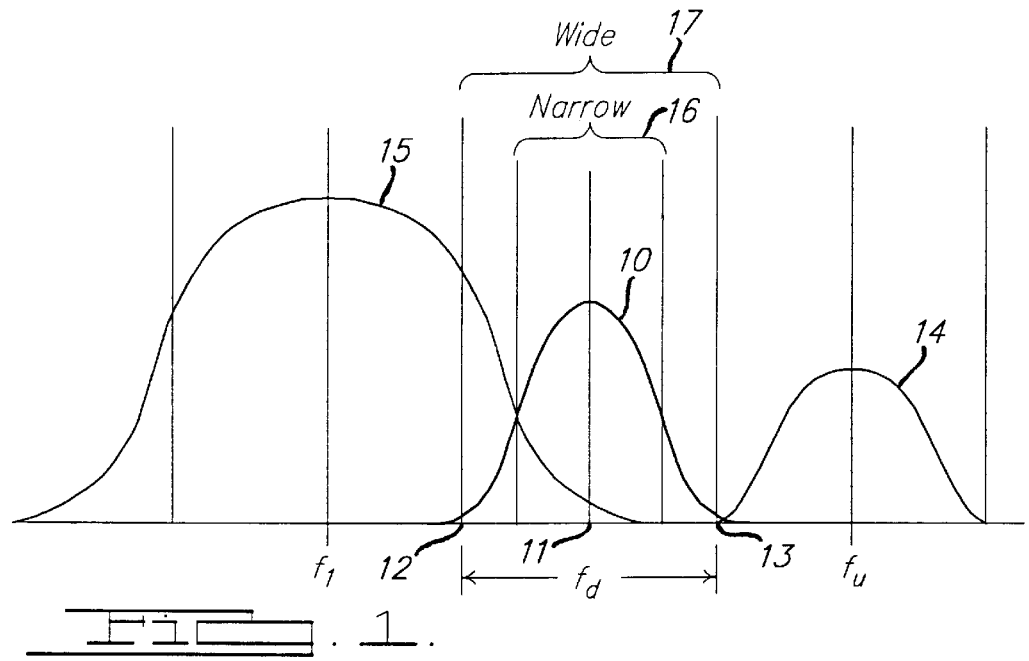
FIG. 1 plots reception field strength in a local reception area in which adjacent channel interference exists for a desired radio channel of interest.

FIG. 1 shows a frequency spectrum 10 of a desired radio broadcast having a center frequency 11 and occupying an assigned channel $f_d$ between a lower frequency 12 and an upper frequency 13. An upper adjacent channel $f_u$ is shown containing a broadcast signal 14 with substantially no excess signal content in the desired frequency channel, whereby the upper adjacent channel is not causing interference. However, a lower adjacent channel at $f_l$ is shown to include a radio broadcast having a frequency spectrum 15 including significant signal content above lower frequency 12 of the desired channel. The resulting interference degrades reception of the desired radio broadcast.

Adjacent channel interference can be reduced by means of narrowing the passband of a bandpass filter in the receiver to reduce the signal content from the adjacent channel passing through the receiver. Thus, FIG. 1 shows a narrow bandwidth 16 which can be switched into the intermediate frequency signal path to alleviate adjacent channel interference. When no adjacent channel interference is present, a wide bandwidth 17 is used in order to maximize quality of the received desired signal. Within the receiver, center frequency 11 is translated to an intermediate frequency, which may be a zero intermediate frequency. In that case, the filter is a lowpass filter.

Figure 2:
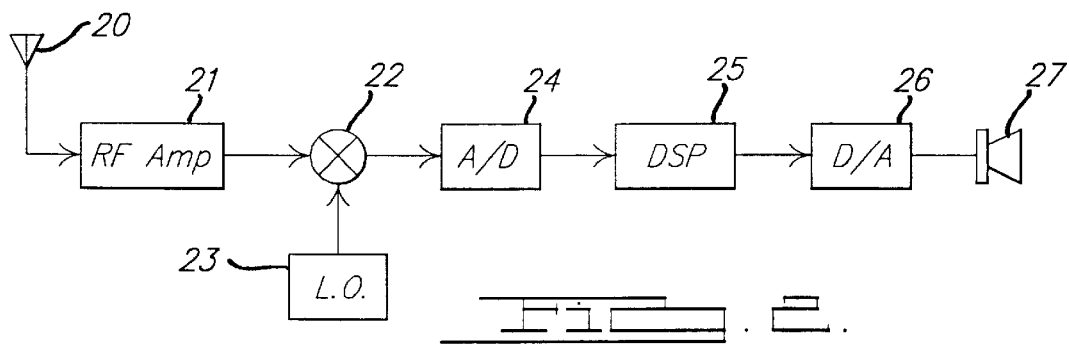
FIG. 2 is a block diagram showing portions of a DSP radio receiver.

FIG. 2 is a block diagram showing a radio receiver using digital signal processing. An antenna 20 receives broadcast RF signals which are coupled to an RF amplifier 21. Amplified RF signals are provided to one input of a mixer 22. A local oscillator 23 provides a mixing signal to a second input of mixer 22, the mixing signal having a frequency under control of a tuning control circuit (now shown). A carrier-based signal in the form of an intermediate frequency (IF) signal is provided from mixer 22 to the input of an analog-to-digital (A/D) converter 24. A digitized IF signal is provided to digital signal processor (DSP) block 25 for filtering, demodulating and other further processing of the resulting audio signal. Block 25 includes data memory and program memory for performing these functions. A final audio signal is output from DSP 25 to the input of a digital-to-analog (D/A) converter 26 which provides analog audio signals to a speaker system 27.

Figure 3:
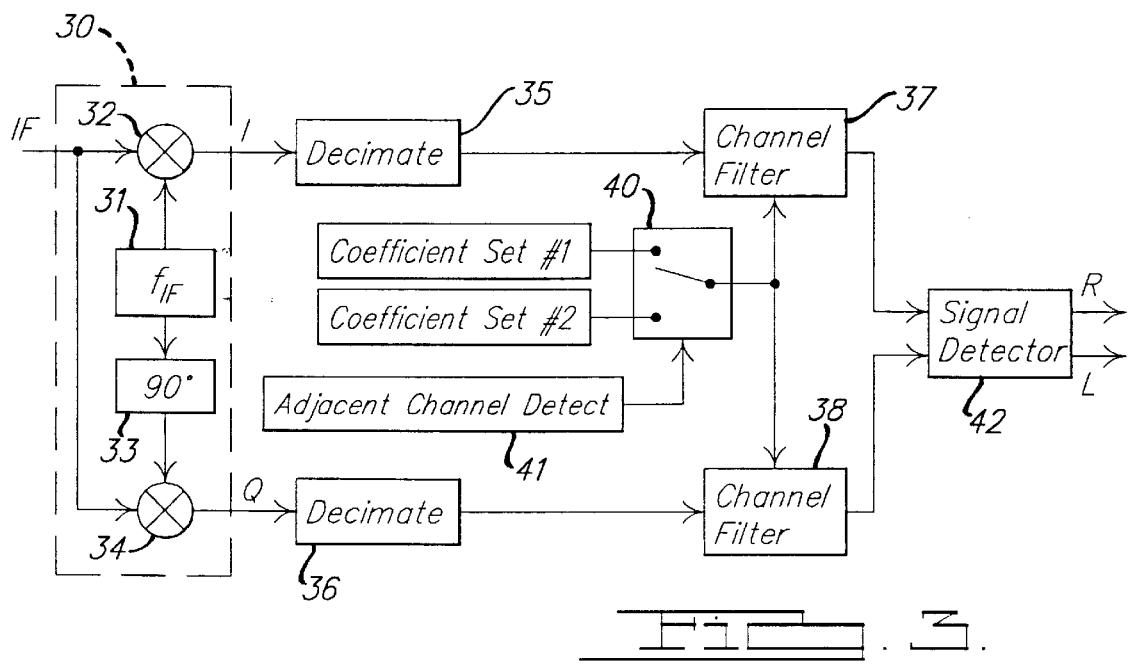
FIG. 3 is a block diagram showing DSP processing of an intermediate frequency signal as used in the present invention.

Processing of the digitized IF signal within DSP 25 is shown in greater detail in FIG. 3. The embodiment of FIG. 3 is particularly adapted for processing AM signals. The digitized IF signal is provided to the input of a complex mixer 30 to produce in-phase (I) and quadrature-phase (Q) signals. An oscillator 31 produces an injection signal $f_{if}$ which is nominally equal to the intermediate frequency of the IF signal so that the IF signal is mixed to a new IF frequency of approximately zero Hertz. The injection signal is coupled directly to one input of a first mixer 32 and through a 90° phase-shift block 33 to an input of a second mixer 34. The digitized IF signal is provided to respective inputs of mixers 32 and 34 to generate the I and Q signals. The I and Q signals are decimated by decimate blocks 35 and 36, respectively, to provide sample-rate-reduced signals to the inputs of channel filters 37 and 38.

Other non-zero IF frequencies or non-complex signal representations can be used with the present invention. However, a zero-IF complex representation has many advantages in DSP processing such as compact code size, minimized chip area, and efficient data manipulation.

Channel filters 37 and 38 can be loaded with a coefficient set #1 or a coefficient set #2 through a multiplexer 40 under control of an adjacent channel detect block 41. One coefficient set provides a wide bandwidth while the other coefficient set provides a narrow bandwidth. A coefficient set to be used at any one time is selected depending upon the presence of adjacent channel interferers. Using a zero Hertz intermediate frequency, channel filters 37 and 38 are implemented as lowpass filters with the narrower filter having an upper cutoff frequency which is lower than that of the wider filter. The presence of adjacent channel interferers can be detected using any conventional method as known in the art. The filtered outputs of channel filters 37 and 38 are provided to a signal detector 42 for generating an audio output which may include left and right stereo signals, for example.

The memory blocks for coefficient sets #1 and #2 may further contain coefficient values to be used during slewing of a selected one of the filter sections. Alternatively, information may be stored to allow for these slewing coefficient values to be calculated when needed.

The channel filters may be implemented using various filter structures and types. An infinite impulse response (IIR) filter as shown in FIG. 4 will be described herein as an example since its use is desirable for its advantages of compact size.

Figure 4:
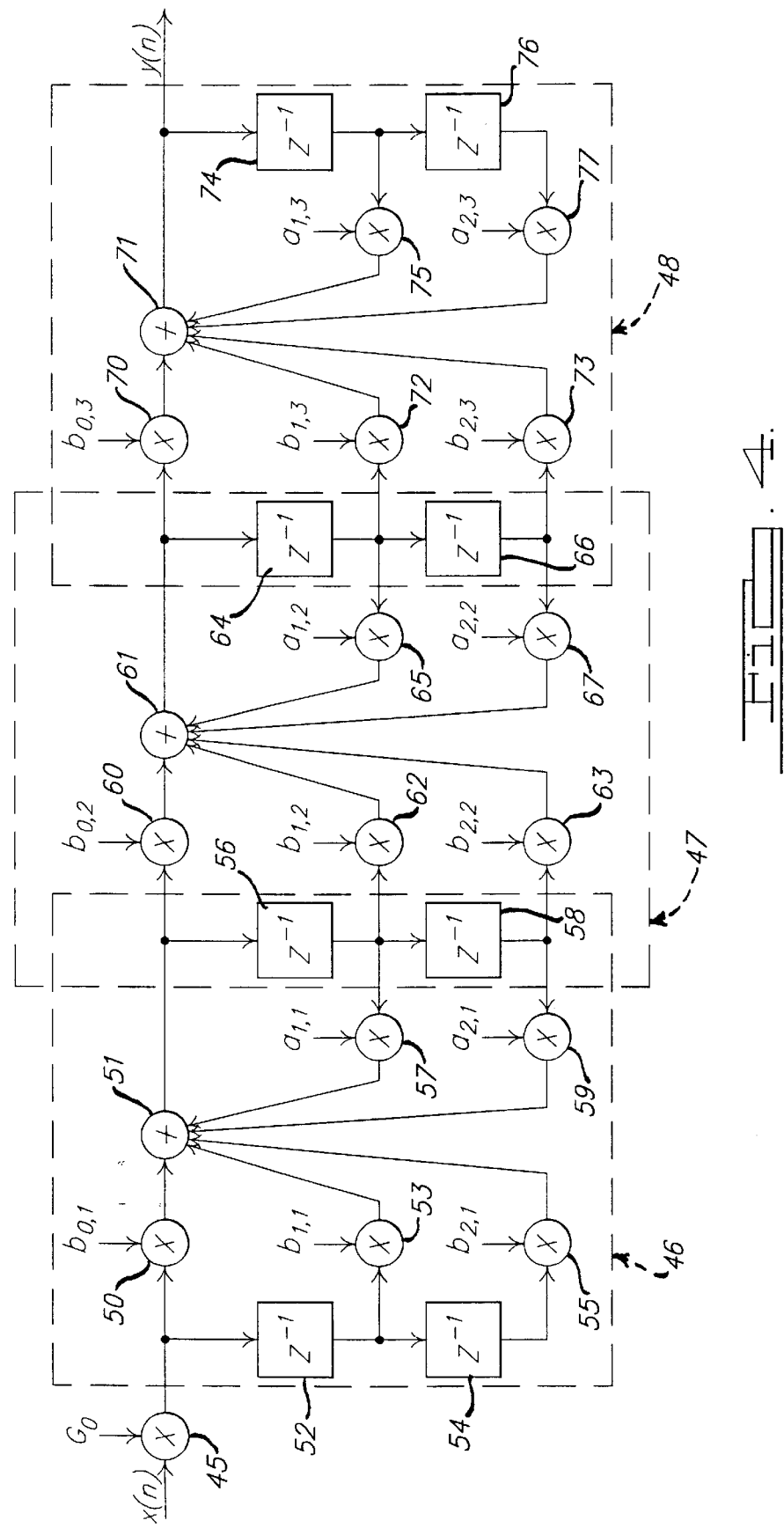
FIG. 4 shows the internal structure of a channel filter.

FIG. 4 shows a typical architecture for an IIR filter comprising three second-order sections cascaded in series between an input x(n) and an output y(n). A filter may include an overall gain term $G_0$ applied to one input of a multiplier 45 which receives input x(n) at its other input. Alternatively, the gain term $G_0$ may be distributed to the individual sections as is known in the art.

Second order sections 46, 47 and 48 are connected in series to produce a sixth order filter. First section 46 includes a multiplier 50 for multiplying the input to section 46 by a coefficient $b_{0,1}$. The resulting product is provided to one input of a summer 51. The output of summer 51 provides the output node for section 46, and is also an internal node of the whole filter.

The input to section 46 is delayed by one sample period in a unit delay block 52 and then input to a multiplier 53. Coefficient $b_{1,1}$ is applied to a second input of multiplier 53 and the output is provided to summer 51. The output of unit delay block 52 is passed through a further unit delay in unit delay block 54 prior to multiplying it in a multiplier 55 by a coefficient $b_{2,1}$. The output of multiplier 55 is provided to yet another input of summer 51. The b coefficients provide the feedforward terms for section 46. Section 46 also includes feedback terms wherein the output of summer 51 is delayed in a unit delay block 56. The delayed output is coupled to a multiplier 57 which also receives a coefficient $a_{1,1}$. The output of multiplier 57 is coupled to another input of summer 51. The delayed output from unit delay block 56 is passed through a unit delay block 58 and then to an input of a multiplier 59. Coefficient $a_{2,1}$ is supplied to another input of multiplier 59 and the resulting product is coupled to summer 51. The output of summer 51, comprising the internal node for the first section 46, is coupled to the input of second section 47. Sections 46 and 47 are shown overlapping since unit delay blocks 56 and 57 are shared between the two section operations in order to minimize hardware requirements.

The input of section 47 (from summer 51) is applied to a multiplier 60 which also receives coefficient $b_{0,2}$. Additional b coefficients $b_{1,2}$ and $b_{2,2}$ are applied to multipliers 62 and 63, respectively, and the resulting products are added in a summer 61. Unit delay block 64, multiplier 65, unit delay block 66, and multiplier 67 provide feedback terms using coefficients $a_{1,2}$ and $a_{2,2}$ as in the previous section. Section 48 operates in the same manner using b coefficients for the third section $b_{0,3}$ $b_{1,3}$ and $b_{2,3}$ and a coefficients $a_{1,3}$ and $a_{2,3}$. In order to provide a final filtering of higher order, more second order sections may be cascaded in series after section 48.

Various methods are well known for determining appropriate values for the a and b coefficients. In a preferred embodiment, a Butterworth filter structure is used. First and second coefficient sets are separately derived for providing a first bandwidth characteristic and a second bandwidth characteristic, respectively, in order to switch a filter between bandwidths while using the same filter hardware and structure as shown in FIG. 3. Thus, by swapping coefficient values between the two coefficient sets, either the wide bandwidth or the narrow bandwidth channel filter can be selected. As used herein, a coefficient set refers to all the a and b coefficients for all the filter sections for providing one bandwidth characteristic.

Using the coefficient sets as obtained with the conventional process, significant audible effects may occur in the audio output when the filter coefficients are changed. The present invention gradually changes the overall filter characteristic to eliminate the audible change in frequency response.

If the bandwidth were to be slewed in discrete steps by using conventional coefficient design techniques at a number of intermediate bandwidths between the wide and narrow settings, a large amount of memory and/or computational resources would be required. If 50 intermediate steps were used, then 50 different full coefficient sets would have to be stored or calculated, making the slewing function an expensive one to implement. However, applicant has found that by slewing one specially selected filter section in a particular way, the desired result can still be achieved.

Slewing all coefficients in all filter sections would cause both the passband and stopband of the filter to gradually change. In the radio receiver of the preferred embodiment, this is not needed. A bandwidth change from narrow to wide occurs only if the receiver has determined that no spurious signals exist that will be in the passband after slewing is completed. In that case, what happens in the stop band does not have a significant audible impact, but the passband does. A bandwidth change from wide to narrow occurs when spurious signals are present in the wider bandwidth. There will be a more severe, audible effect when switching the stopband, but this is less important since the audible reception condition in this case will not be good anyway, and the slewing of the passband will still be helpful.

To slew the corner frequency of a single second order section of an IIR filter, the $a_1$ term is slewed. In order to preserve a constant overall passband gain of the section, the $b_0$, $b_1$, and $b_2$ terms must be adjusted accordingly. In a Butterworth filter, $b_1 = 2*b_0 = 2*b_2$, so only $b_0$ must be calculated. Slewing $a_1$, is accomplished by adjusting it slightly (by an adjustment amount) on each iteration of a timing loop, until $a_1$ is completely changed from its start value to its end value. On each iteration, the b values are determined based on the current value of $a_1$. Alternatively, some or all the slewing values could be stored in a table. Note that by changing $a_1$ without changing $a_2$, the corner frequency of the section is changed without changing the Q of the section.

The start values (when going from narrow to wide) or the end values (when going from wide to narrow) for the slewing of the selected section may correspond to the actual set of coefficients for the selected section when switched to the narrowband characteristic. However, it may be more desirable to use a surrogate set of coefficient values which provides a passband characteristic (when combined with the remaining sections) which best approximates the overall passband of the digital filter when it is providing its narrowband characteristic. By using the best approximation within one section of the overall filter passband characteristic, any audible effects of the sudden switching of the filter coefficients all together are reduced as much as possible. The surrogate values are determined during filter design using conventional techniques.

Referring to FIG. 5, the procedure for slewing from wideband to narrowband begins in step 80 where coefficient $a_1$ of the selected section is changed by an adjustment amount. The total time to slew equals the number of iterations divided by the iteration rate, and the total span of values equals the number of iterations times the adjustment amount. A typical slewing time may be about 12 seconds and a typical number of iterations may be about 123. These are not necessarily the same in both slewing directions.

In step 81, the b coefficients of the selected section are calculated and loaded into the filter along with the new value for $a_1$. Specifically, the new value for $b_0$ is determined as $k_1*a_1+k_2$, where $k_1$ and $k_2$ are predetermined constants. New values for $b_1$ and $b_2$ are determined from $b_0$ as given above. The $a_2$ term need not be changed or slewed since it has no effect on the corner frequency of the filter section.

In step 82, a check is made to determine whether the surrogate value of $a_1$ has been reached. If not, then a loop delay is implemented in step 83 and then a return is made to step 80 for the next iteration. If the surrogate value of $a_1$ has been reached, then a coefficient swap to the narrow filter coefficient values is made in step 84. If the surrogate values are not equal to the narrow values for the selected section, then the selected section also participates in the swap.

Referring to FIG. 6, the procedure for slewing from narrowband to wideband begins in step 90 where all coefficients (except the selected section) are swapped to their wide values. If the surrogate values do not equal the narrow values for the selected section, then the selected section is swapped to the surrogate values in step 91.

In step 92, coefficient $a_1$ of the selected section is changed by the adjustment amount. In step 93, the b coefficients of the selected section are calculated and loaded into the selected section along with the new value for $a_1$. In step 94, a check is made to determine whether the end wideband values have been reached. If not, then a loop delay is implemented in step 95 and then a return is made to step 92 for the next iteration. If the wideband values have been reached, then the procedure is done.

A preferred criteria for selecting the filter section to be slewed will be described with reference to FIGS. 7A–7D. For most applications, it is desirable to choose the filter section with the flattest frequency response in the passband. A section with an optimally flat frequency response is one that has a Q value of 0.707, or is critically damped. Thus, it is a preferred embodiment of the invention to select the filter section having a Q value in its wideband configuration closest to 0.707 as the section to be slewed. The selected section may well also be the one with a Q value closest to 0.707 in its narrowband configuration, but this is not required since surrogate coefficient values can be used for slewing. FIGS. 7A to 7D show frequency responses for individual sections of the filter. FIG. 7B corresponds to the flattest frequency response and has a Q value closest to 0.707. A section with a lower Q value (e.g., FIG. 7D) has a shallower roll-off and is not flat over its passband (considered as a separate filter). If such a section is the one slewed, the whole filter's passband becomes less flat and the corner frequency is not well controlled during slewing. A section with a higher Q value is likewise not flat in its passband (e.g., FIG. 7A) and is less able to control the corner frequency during slewing.

A filter section other than the flattest may alternatively be used for slewing. For example, there may be applications where it is desirable to either emphasize or de-emphasize particular frequencies during slewing, for which an appropriate filter section can be selected.

What is claimed is:

1. A method of slewing between a first bandwidth characteristic and a second bandwidth characteristic in a switched bandwidth digital filter including a plurality of second-order filter sections, each of said sections comprising respective coefficients having a first set of values in providing said first bandwidth characteristic and having a second set of values in providing said second bandwidth characteristic, said method comprising the steps of:

slewing said coefficients of a selected filter section between said first set of values and a surrogate set of values while coefficients in said filter sections other than said selected filter section are held constant;

swapping said coefficients of said filter sections other than said selected filter section from their respective first set of values to their respective second set of values.

2. The method of claim 1 wherein said coefficients of said selected filter section are swapped between said surrogate set of values and said second set of values for said selected filter section when said coefficients of said other filter sections are swapped.

3. The method of claim 1 wherein said surrogate set of values is equal to said second set of values of said selected filter section.

4. The method of claim 1 wherein said surrogate set of values provides said selected filter section with a passband characteristic which approximates an overall passband of said digital filter when it is providing its narrower bandwidth characteristic.

5. The method of claim 1 wherein said first bandwidth characteristic is wider than said second bandwidth characteristic, and wherein said slewing step is performed prior to said swapping step.

6. The method of claim 1 wherein said first bandwidth characteristic is narrower than said second bandwidth characteristic, and wherein said swapping step is performed prior to said slewing step.

7. The method of claim 1 wherein said slewing step includes a predetermined number of iterations between said first set of values and said surrogate set of values, and wherein each of said iterations is comprised of changing one of said coefficients within said selected section by a predetermined adjustment value.

8. The method of claim 7 wherein coefficient values used during each of said iterations are retrieved from a memory.

9. The method of claim 7 wherein each of said iterations is comprised of calculating a new value for at least one of said coefficients in response to said changing of a different one of said coefficients by said predetermined adjustment value.

10. The method of claim 1 wherein said selected section is substantially critically damped when said filter is providing its wider bandwidth characteristic.

* * * * *